(12) United States Patent
Lan

(10) Patent No.: US 11,800,660 B2
(45) Date of Patent: Oct. 24, 2023

(54) SUPPORTING APPARATUS, SCREEN ASSEMBLY AND TERMINAL DEVICE

(71) Applicant: BEIJING XIAOMI MOBILE SOFTWARE CO., LTD., Beijing (CN)

(72) Inventor: Baoguang Lan, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/515,199

(22) Filed: Oct. 29, 2021

(65) Prior Publication Data

US 2022/0322548 A1    Oct. 6, 2022

(30) Foreign Application Priority Data

Mar. 31, 2021 (CN) .......................... 202110352245.0

(51) Int. Cl.
  *H05K 5/02* (2006.01)
  *G06F 1/16* (2006.01)
(52) U.S. Cl.
  CPC ......... *H05K 5/0217* (2013.01); *G06F 1/1652* (2013.01)
(58) Field of Classification Search
  CPC .... H05K 5/0217; G06F 1/1652; G06F 1/1641
  See application file for complete search history.

(56) References Cited

U.S. PATENT DOCUMENTS

| 10,976,775 | B1* | 4/2021 | Cha | G06F 1/1622 |
| 2010/0246113 | A1* | 9/2010 | Visser | G09F 9/301 |
| | | | | 361/679.3 |
| 2013/0058063 | A1 | 3/2013 | O'Brien | |
| 2018/0014417 | A1* | 1/2018 | Seo | H05K 1/189 |
| 2018/0374411 | A1* | 12/2018 | Yang | G06F 3/04845 |
| 2020/0201394 | A1* | 6/2020 | Choi | H05K 5/0017 |
| 2020/0267246 | A1* | 8/2020 | Song | H05K 1/148 |
| 2020/0314225 | A1* | 10/2020 | Ahn | G06F 1/1652 |
| 2021/0405696 | A1* | 12/2021 | Ahn | G06F 1/1647 |
| 2022/0038564 | A1* | 2/2022 | Li | G06F 1/1652 |
| 2022/0071030 | A1* | 3/2022 | Li | H05K 5/0217 |
| 2022/0078270 | A1* | 3/2022 | Song | H04M 1/0237 |
| 2022/0183167 | A1* | 6/2022 | Liu | H04M 1/0237 |
| 2022/0183173 | A1* | 6/2022 | Kim | H05K 5/0017 |

OTHER PUBLICATIONS

Extended European Search Report of EP Application No. 21205301.1 dated May 2, 2022, (12p).

* cited by examiner

*Primary Examiner* — Sagar Shrestha

(74) *Attorney, Agent, or Firm* — Arch & Lake LLP

(57) ABSTRACT

A supporting apparatus for supporting a flexible display screen includes a support frame including an overturning curved surface; and a driving mechanism disposed at a side, away from the overturning curved surface, of the support frame. The driving mechanism includes an adjustable rod configured to extend or contract in an adjustment direction; an axial direction of the overturning curved surface is perpendicular to an adjustment direction of the adjustable rod; and the adjustable rod is configured to be connected with the display screen overturned along the overturning curved surface, and the adjustable rod is configured to push the support frame to move during extension and to pull the display screen to move during contraction.

18 Claims, 6 Drawing Sheets

SUPPORTING APPARATUS, SCREEN ASSEMBLY AND TERMINAL DEVICE

CROSS REFERENCE TO RELATED APPLICATION

The present application is based upon and claims priority to Chinese Patent Application No. 202110352245.0, filed on Mar. 31, 2021, the entire content of which is incorporated herein by reference for all purposes.

TECHNICAL FIELD

The present disclosure relates to the technical field of terminal devices, in particular to, a supporting apparatus, a screen assembly and a terminal device.

BACKGROUND

In recent years, there are more and more terminal devices with extendable screens which may be extended to expand when a large screen is required and may be contracted to shrink when a small screen is required, and therefore, various different application scenarios may be met. The state of the extendable screens in the related art is unstable, which is particularly more obvious in an extension/contraction process, thereby greatly affecting the use experience of a user.

SUMMARY

According to a first aspect of the present disclosure, a supporting apparatus for supporting a flexible display screen is provided, including: a support frame comprising an overturning curved surface; and a driving mechanism disposed at a side, away from the overturning curved surface, of the support frame, and the driving mechanism comprises an adjustable rod configured to extend or contract in an adjustment direction. The axial direction of the overturning curved surface is perpendicular to an adjustment direction of the adjustable rod; and the adjustable rod is configured to be connected with the display screen overturned along the overturning curved surface, and the adjustable rod is configured to push the support frame to move during extension and to pull the display screen to move during contraction.

According to a second aspect of the present disclosure, a screen assembly is provided, including a flexible display screen and one or more supporting apparatuses for supporting the display screen. The supporting apparatus includes: a support frame comprising an overturning curved surface; and a driving mechanism disposed at a side, away from the overturning curved surface, of the support frame, and the driving mechanism comprises an adjustable rod configured to extend or contract in an adjustment direction. The axial direction of the overturning curved surface is perpendicular to an extension or a contraction direction of the adjustable rod; and the adjustable rod is configured to be connected with the display screen overturned along the overturning curved surface, and the adjustable rod is configured to push the support frame to move during extension and to pull the display screen to move during contraction. Each supporting apparatus is used for extending or contracting one side of the display screen.

According to a third aspect of the present disclosure, a terminal device is provided, including the screen assembly, wherein the screen assembly includes a flexible display screen and one or more supporting apparatus for supporting the display screen. The supporting apparatus includes: a support frame comprising an overturning curved surface; and a driving mechanism disposed at a side, away from the overturning curved surface, of the support frame, and the driving mechanism comprises an adjustable rod configured to extend or contract in an adjustment direction. The axial direction of the overturning curved surface is perpendicular to an adjustment direction of the adjustable rod; and the adjustable rod is configured to be connected with the display screen overturned along the overturning curved surface, and the adjustable rod is configured to push the support frame to move during extension and to pull the display screen to move during contraction. Each supporting apparatus is used for extending or contracting one side of the display screen.

BRIEF DESCRIPTION OF THE DRAWINGS

The accompanying drawings, which are incorporated in and constitute a part of this description, illustrate examples conforming to the present disclosure, and serve to explain the principles of the present disclosure together with the description.

FIG. 3 is a rear view showing a screen assembly of a terminal device in a contraction state shown in one or more examples of the present disclosure in;

DETAILED DESCRIPTION

Embodiments will be described in detail herein, and examples of the embodiments are illustrated in the accompanying drawings. When the following description involves the accompanying drawings, the same numerals in different accompanying drawings represent the same or similar elements unless otherwise indicated. The implementations described in the following examples do not represent all implementations consistent with the present disclosure. On the contrary, they are merely examples of an apparatus and a method consistent with some aspects of the present disclosure as detailed in the appended claims.

Terms used in the present disclosure are merely for the purpose of describing specific examples, rather than limiting the present disclosure. "A", "an", "the" and "this" used in a singular form in the present disclosure and the appended claims are also intended to include a plural form unless other meanings are clearly expressed in the contexts. It should be further understood that the term "and/or" used herein refers to and includes any one or all of possible combinations of one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms such as first, second and third may be adopted to describe various information in the present disclosure, the information should not be limited to these terms. These terms are merely used to distinguish the same type of information. For example, first information may be referred to as second information, similarly, the second information may also be referred to as the first information without departing from the scope of the present disclosure. According to the context, the word "if" used herein may be interpreted as "while" or "when" or "determining . . . in response to".

Figure 1:
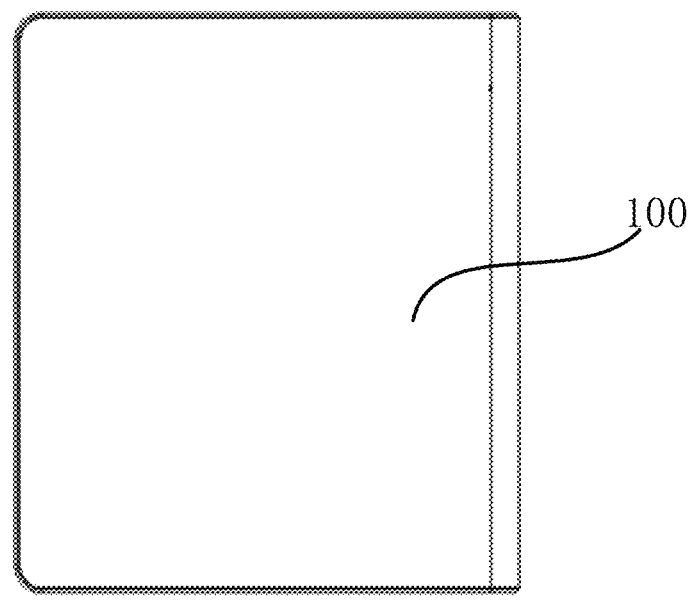
FIG. 1 is a front view showing a screen assembly of a terminal device in a contraction state shown in one or more examples of the present disclosure.
Figure 2:
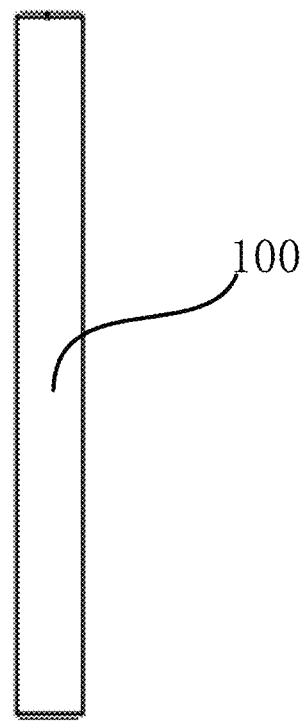
FIG. 2 is a side view showing a screen assembly of a terminal device in a contraction state shown in one or more examples of the present disclosure.
Figure 3:
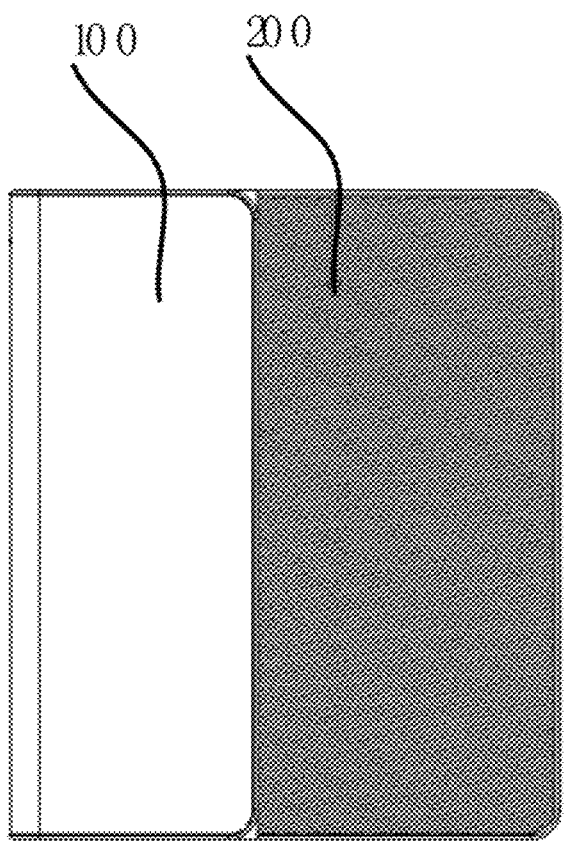
Figure 4:
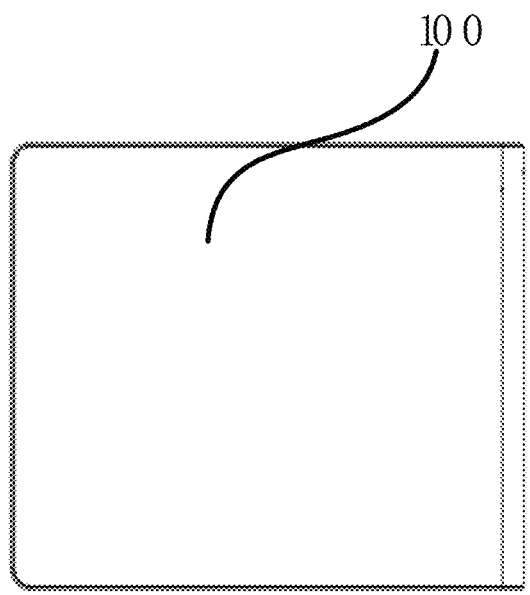
FIG. 4 is a front view showing a screen assembly of a terminal device in an extension state shown in one or more examples of the present disclosure.
Figure 5:
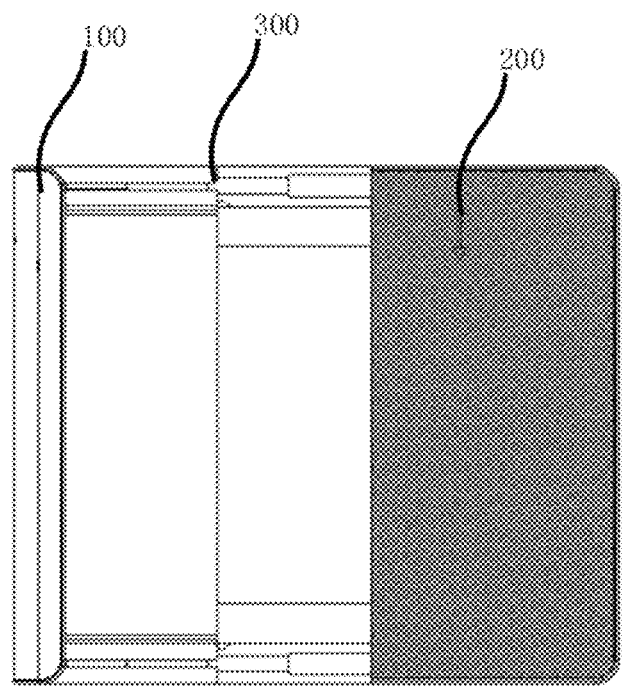
FIG. 5 is a rear view showing a screen assembly of a terminal device in an extension state shown in one or more examples of the present disclosure.
Figure 6:
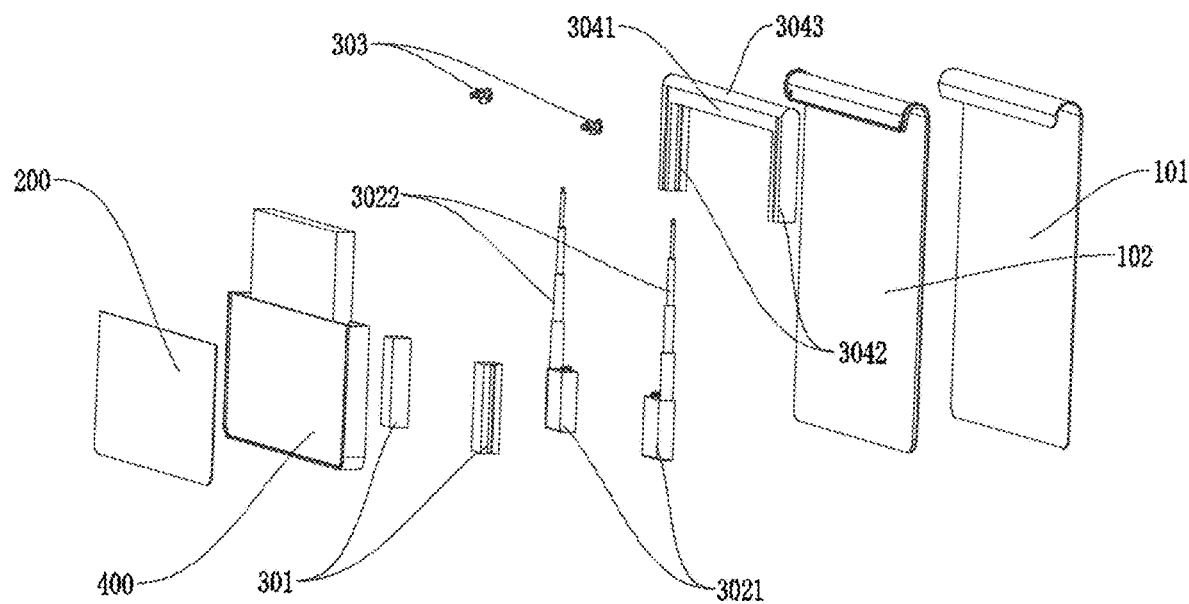
FIG. 6 is an exploded view showing a screen assembly of a terminal device shown in one or more examples of the present disclosure.
Figure 7:
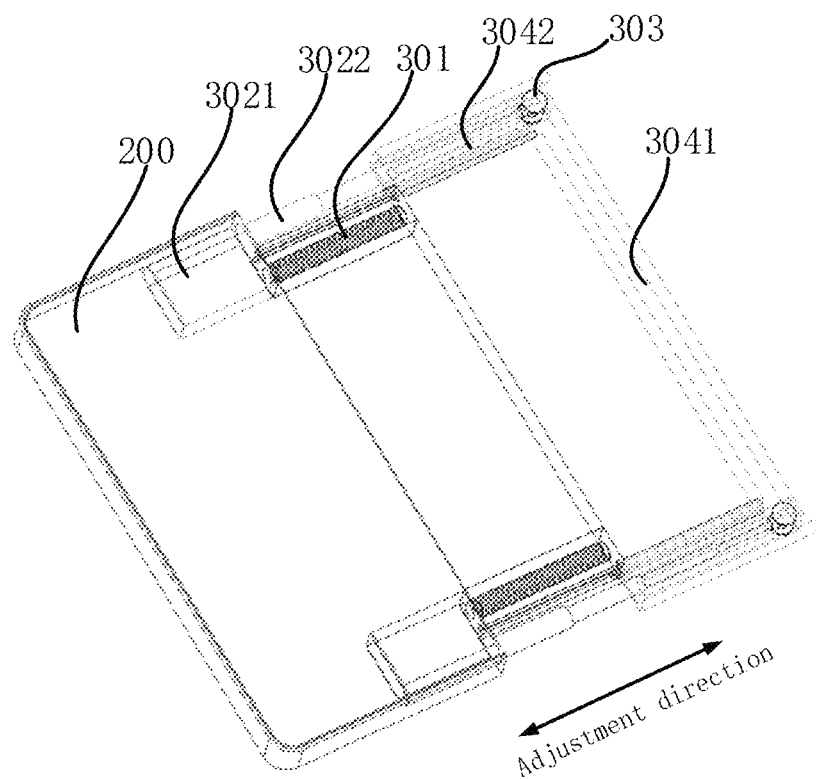
FIG. 7 is a perspective view showing a supporting apparatus of a terminal device in an extension state shown in one or more examples of the present disclosure.
Figure 8:
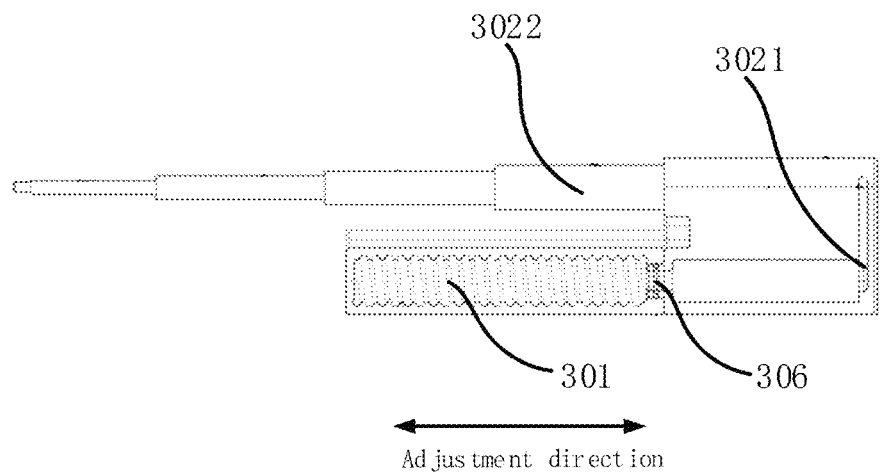
FIG. 8 is a structural schematic diagram showing a driving mechanism of a terminal device shown in one or more examples of the present disclosure.
Figure 9:
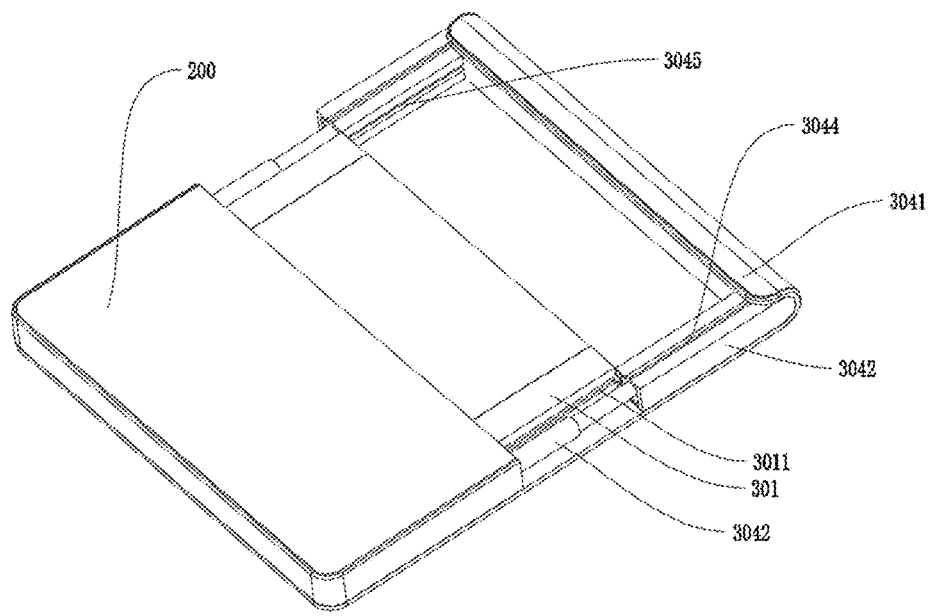
FIG. 9 is a structural schematic diagram showing a supporting apparatus of a terminal device in an extension state shown in one or more examples of the present disclosure.
Figure 10:
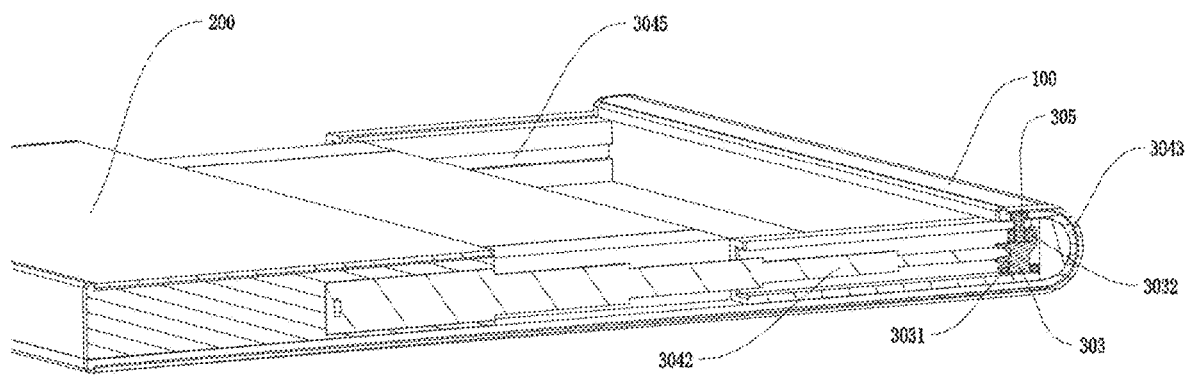
FIG. 10 is a section view showing a supporting apparatus of a terminal device in an extension state shown in one or more examples of the present disclosure.
Figure 11:
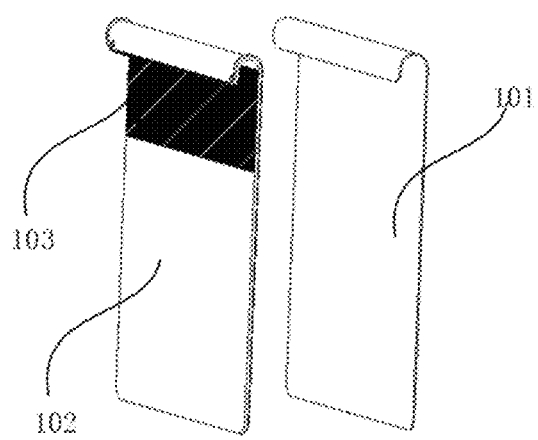
FIG. 11 is an exploded view showing a display screen of a terminal device shown in one or more examples of the present disclosure.

Structures of a supporting apparatus, a screen assembly and a terminal device provided by the present disclosure will be introduced with reference to FIG. 1 to FIG. 11, wherein FIG. 1 is a front view showing a screen assembly of a terminal device in a contraction state shown in an example of the present disclosure; FIG. 2 is a side view showing a screen assembly of a terminal device in a contraction state shown in an example of the present disclosure; FIG. 3 is a rear view showing a screen assembly of a terminal device in a contraction state shown in an example of the present disclosure; FIG. 4 is a front view showing a screen assembly of a terminal device in an extension state shown in an example of the present disclosure; FIG. 5 is a rear view showing a screen assembly of a terminal device in an extension state shown in an example of the present disclosure; FIG. 6 is an exploded view showing a screen assembly of a terminal device shown in an example of the present disclosure; FIG. 7 is a perspective view showing a supporting apparatus of a terminal device in an extension state shown in an example of the present disclosure; FIG. 8 is a structural schematic diagram showing a driving mechanism of a terminal device shown in an example of the present disclosure; FIG. 9 is a structural schematic diagram showing a supporting apparatus of a terminal device in an extension state shown in an example of the present disclosure; FIG. 10 is a section view showing a supporting apparatus of a terminal device in an extension state shown in an example of the present disclosure; and FIG. 11 is an exploded view showing a display screen of a terminal device shown in an example of the present disclosure.

In a first aspect, an example of the present disclosure provides a supporting apparatus used for supporting a flexible display screen 100. The supporting apparatus includes a support frame including an overturning curved surface 3043 and a driving mechanism disposed at a side, away from the overturning curved surface 3043, of the support frame, wherein the driving mechanism includes an adjustable rod 3022 configured to extend or contract in an adjustment direction. An axial direction of the overturning curved surface 3043 is perpendicular to an adjustment direction of the adjustable rod 3022. The adjustable rod 3022 is configured to be connected with the display screen overturned along the overturning curved surface, and the adjustable rod is configured to push the support frame to move during extension and to pull the display screen 100 to move during contraction.

The thickness of the supporting apparatus 300 may be smaller than the thickness of the terminal device, that is, the thickness of the support frame may be smaller than the thickness of the terminal device, and the thickness of the driving mechanism may be smaller than the thickness of the terminal device. The width of the supporting apparatus 300 may be matched with the width of the terminal device (i.e., the length of a side, corresponding to a mounting position of the supporting apparatus 300, of the terminal device), so that the range that the supporting apparatus 300 supports against the display screen 100 is consistent with the range that a main body (such as a middle frame) of the terminal device supports against the display screen 100. That is, the width of the support frame may be matched with the width of the terminal device (i.e., the length of the side, corresponding to the mounting position of the supporting apparatus 300, of the terminal device). The length of the supporting apparatus 300 may be changed, that is, the length of the supporting apparatus 300 is changed when the adjustable rod 3022 of the supporting apparatus 300 pushes the support frame to move or pull the display screen 100 to contract. Specifically, when the adjustable rod 3022 pushes the support frame to move, the supporting apparatus 300 is lengthened to achieve an extension effect, and thus, the display screen 100 achieves an extension effect; and when the adjustable rod 3022 pulls the display screen 100 to contract, the supporting apparatus 300 is shortened to achieve a contraction effect, and thus, the display screen 100 achieves a contraction effect.

The overturning curved surface 3043 of the support frame forms a side (i.e., the side, corresponding to the mounting position of the supporting apparatus 300, of the terminal device) of the terminal device, and the display screen 100 continues to extend along the overturning curved surface 3043 when extending from front to the side, thereby completing overturning and continuing to extend along the rear of the terminal device, and further, wrapping the supporting apparatus 300 in the display screen 100.

Technical solutions provided by the examples of the present disclosure may include the following beneficial effects:

Due to the disposal of the support frame with the overturning curved surface 3043 in the present disclosure, the flexible display screen 100 may overturn along the overturning curved surface 3043. Moreover, due to the disposal of the driving mechanism at the side, away from the overturning curved surface 3043, of the support frame, the adjustable rod 3022 of the driving mechanism is configured to push the support frame to move during extension, and the extension of the supporting apparatus 300 is achieved in a process that the support frame is pushed, and thus, the extension of the display screen 100 is achieved. Besides, the adjustable rod 3022 is connected with the overturned display screen 100, and therefore, the adjustable rod 3022 is configured to pull the display screen 100 to move during contraction to achieve the contraction of the display screen 100; and the support frame is pulled back to an original position in the contraction process, and therefore, the adjustable rod 3022 extends or contracts to realize the extension or contraction of the display screen 100. Since the support frame pushes the display screen 100 to extend during the extension process while the display screen 100 pulls the support frame to contract during the contraction process, the display screen 100 is always tightly attached to the support frame in the extension/contraction process, and the state stability of an extendable screen is improved. Moreover, the adjustable rod 3022 extends or contracts to supply power in an extension/contraction process, so that a noise problem caused by a complicated mechanical structure is avoided.

In some examples of the present disclosure, the support frame includes an adjustment channel for accommodating the adjustable rod 3022, and a first sliding chute 3044 passing through a side wall of the adjustment channel. An extension direction of the first sliding chute 3044 is parallel to an axial direction of the adjustment channel. A first sliding block 305 is disposed in the first sliding chute 3044, in which a first end of the first sliding block 305 is connected with the display screen 100, and a second end of the first sliding block extends into the adjustment channel. When extending and abutting against a bottom wall of the adjustment channel, the adjustable rod 3022 is configure to push the support frame to move; and when contracting, the adjustable rod 3022 is configured to pull the first sliding block 305 to slide along the first sliding chute 3044.

Due to the disposal of the adjustment channel, it is convenient for the adjustable rod 3022 to extend or contract, and interference to the sliding of the display screen 100 relative to the support frame may be avoided. Furthermore, due to the disposal of the first sliding chute 3044 and the first sliding block 305, the adjustable rod 3022 can pull the display screen 100 to move in the adjustment channel.

The axial direction of the adjustment channel is parallel to the adjustment direction of the adjustable rod 3022. The first sliding chute 3044 may be disposed between the display screen 100 and the adjustment channel, thereby facilitating the connection between the display screen 100 and the adjustable rod 3022. Optionally, the first sliding chute 3044 is formed at the rear of the support frame (corresponding to the rear of the terminal device).

In an example, the first sliding block 305 may be a screw. A screw rod of the screw enters the adjustment channel after sequentially passing through the display screen 100 and the first sliding chute 3044, and a nut of the screw may be located outside the display screen 100 or embedded into the display screen 100. The screw rod may be sleeved with a nut located in the adjustment channel, so that the screw is limited, and thus, the tightness of the display screen 100 and the support frame may be improved.

Optionally, a tail end of the adjustable rod 3022 is provided on a bearing base 303. One or more bearings 3031 are sleeved on the bearing base 303, and an outer ring of a bearing 3031 is connected with the side wall of the adjustment channel. The bearing base 303 may include a first supporting rod, a second supporting rod and a third supporting rod. One end of the first supporting rod and one end of the second supporting rod are connected with one end of the third supporting rod. The first supporting rod is coaxial with the second supporting rod, and the first supporting rod is perpendicular to the third supporting rod. The first supporting rod may be disposed in a thickness or width direction of the supporting apparatus 300. The third supporting rod may be fixedly connected with the tail end of the adjustable rod 3022. At least one of the first supporting rod and the second supporting rod is sleeved with the bearing 3031. When the adjustable rod 3022 extends or contracts in the adjustment channel, the bearing 3031 rolls on the side wall of the adjustment channel, thereby avoiding friction and noise caused by sliding.

Optionally, the adjustable rod 3022 or the bearing base 303 includes a protrusion 3032 matched with the first sliding block 305, and the protrusion 3032 is configured to abut against the first sliding block 305 when the adjustable rod 3022 contracts. The protrusion 3032 is disposed at a side, away from the driving mechanism, of the first sliding block 305 (such as the nut of the screw), and therefore, when extending along with the adjustable rod 3022, the protrusion 3032 may not apply an acting force to the first sliding block 305; and when contracting along with the adjustable rod 3022, the protrusion 3032 may abut against the first sliding block 305 and apply an acting force in a direction towards the driving mechanism to the first sliding block 305, so that the first sliding block 305 may be pulled to move towards the direction close to the driving mechanism, and further, the display screen 100 is driven to move towards the direction close to the driving mechanism.

Based on the structure of the above-mentioned support frame and a positional relationship between the adjustable rod 3022 and the support frame, states of the adjustable rod 3022 during extension and contraction are described as follows:

When the adjustable rod 3022 completely contracts, the tail end of the adjustable rod 3022 is located at an opening of the adjustment channel, and a tail end of the display screen 100 is located at the opening of the adjustment channel, that is, the display screen 100 completely covers the support frame.

When the adjustable rod 3022 starts to extend, the acting force may not be applied to the first sliding block 305, and therefore, when extending to abut against the bottom wall of the adjustment channel, the adjustable rod 3022 starts to push the support frame to move towards a direction away from the driving mechanism. The support frame drives the display screen 100 to slide relative to the support frame in a movement process, and meanwhile, the first sliding block 305 slides towards the direction away from the driving mechanism in the first sliding chute 3044. When the adjustable rod 3022 extends to an extreme position, the tail end of the display screen 100 moves to a position close to the overturning curved surface 3043, and the first sliding block 305 abuts against the protrusion 3032. At the moment, the adjustable rod 3022 is in a complete extension state, and the display screen 100 is in a complete extension state.

When the adjustable rod 3022 starts to contract, the protrusion 3032 pulls the first sliding block 305 to move towards the direction close to the driving mechanism, and then pulls the display screen 100 to move towards the direction close to the driving mechanism. The display screen 100 not only slides relative to the support frame, but also pulls the support frame to move towards the direction close to the driving mechanism in a movement process. When the adjustable rod 3022 contracts to the extreme position, the support frame moves to the extreme position (that is, a position the support frame abuts against the driving mechanism). Moreover, the tail end of the adjustable rod 3022 is located at the opening of the adjustment channel, and the tail end of the display screen 100 is located at the opening of the adjustment channel, that is, the display screen 100 completely covers the support frame. At the moment, the adjustable rod 3022 restores to be in complete contraction, that is, the display screen 100 is in the complete contraction state.

In some examples of the present disclosure, the driving mechanism includes a hydraulic module and a magnetic module 301, wherein the hydraulic module includes a hydraulic main body 3021 and the adjustable rod 3022, and the magnetic module 301 supplies power for the hydraulic main body 3021. The magnetic module 301 may be electrified to generate magnetism, thereby applying kinetic energy to a magnetic member in the hydraulic main body 3021, and further, the kinetic energy is converted to achieve an extension/contraction function of the adjustable rod 3022. When the magnetic module 301 is connected with the hydraulic main body 3021, the magnetic module 301 and the hydraulic main body 3021 may be sealed by using a sealing ring 306, so that the tightness in the hydraulic main body 3021 is guaranteed. By adopting the hydraulic module for extension and contraction, and the magnetic module for supplying power for the hydraulic main body 3021, the state stability of the extendable screen is further improved, and a noise problem caused by a complicated mechanical structure is further avoided.

In some examples of the present disclosure, the supporting apparatus 300 includes one or more driving mechanisms. The support frame includes a support frame main body 3041 and one or more supporting parts 3042 perpendicularly connected with the support frame main body 3041. A side, away from the supporting part 3042, of the support frame main body 3041 is provided with the overturning curved surface 3043. The supporting part 3042 is provided with the adjustment channel and the first sliding chute 3044. The one or more driving mechanisms are in one-to-one correspondence to the one or more supporting parts 3042.

The supporting part 3042 may be of a square or round tubular structure, a hollow channel inside which forms the adjustment channel, and an opening in a side wall of the supporting part forms the first sliding chute 3044. By designing the support frame to be in a form including the support frame main body 3041 and a plurality of supporting parts 3042, not only the connection between the driving mechanism and the support frame is facilitated, but also the weight of the support frame is reduced, therefore, the driving difficulty is lowered, and the weight of the terminal device is reduced.

In some examples of the present disclosure, the adjustable rod 3022 and the magnetic module 301 are disposed at a same side of the hydraulic main body 3021, and an extension direction of the magnetic module 301 is parallel to the adjustment direction of the adjustable rod 3022. The supporting part 3042 includes a second sliding block 3045, and the magnetic module 301 includes a second sliding chute 3011. The second sliding block 3045 is disposed in the second sliding chute 3011 and is configured to slide along the second sliding chute 3011, wherein an extension direction of the second sliding chute 3011 is the same as the extension direction of the first sliding chute 3044, and a depth direction of the second sliding chute 3011 is perpendicular to a depth direction of the first sliding chute 3044.

The adjustable rod 3022 and the magnetic module 301 are disposed at a side, close to the support frame, of the hydraulic main body 3021 side by side, and the adjustable rod 3022 and the magnetic module 301 are disposed in the width direction of the supporting apparatus 300, so that the supporting part 3042 sleeving outside the adjustable rod 3022 and the magnetic module 301 are also disposed side by side, and the supporting part 3042 and the magnetic module 301 are disposed in the width direction of the supporting apparatus 300. Outer surfaces of the supporting part 3042 and the magnetic module 301 may be attached to each other, so that a sliding direction of the supporting part 3042 may be displayed when the position of the driving mechanism is fixed (for example, inside the terminal device). And further, the sliding direction of the supporting part 3042 is further limited by the second sliding block 3045 and the second sliding chute 3011 disposed between the supporting part 3042 and the magnetic module 301. Optionally, the depth direction of the second sliding chute 3011 is set as the width direction of the supporting apparatus 300, the depth direction of the first sliding chute 3044 is set as the thickness direction of the supporting apparatus 300. The shake of the supporting part 3042 in various directions during sliding may be limited by the first sliding chute 3044 and the second sliding chute 3011 whose depth directions are perpendicular, so that the state stability of extension/contraction of the support frame is further improved, that is, the state stability of extension/contraction of the display screen 100 is improved.

In an example, the second sliding block 3045 has magnetism, wherein when the second sliding block 3045 is close to the hydraulic main body 3021, the magnetism of the magnetic module 301 is opposite to the magnetism of the second sliding block 3045, and when the second sliding block 3045 is away from the hydraulic main body 3021, the magnetism of the magnetic module 301 is the same as the magnetism of the second sliding block 3045. Due to the disposal of the second sliding block 3045 having the magnetism, the support frame may be further pushed to move by a repulsive force between the second sliding block 3045 and the magnetic module 301 in a process that the support frame is away from the driving mechanism, and the support frame is further pulled to move by a magnetic attractive force between the second sliding block 3045 and the magnetic module 301 in a process that the support frame is towards the driving mechanism.

In some examples of the present disclosure, the support frame includes two supporting parts 3042 which are respectively connected with each end of the support frame main body 3041. The magnetic module 301 of the driving mechanism is disposed inside a corresponding supporting part 3042. By the two supporting parts 3042 disposed at two ends of the support frame main body 3041, an acting force may be applied to the support frame main body 3041 from the two ends of the support frame main body 3041, thereby improving the movement stability of the support frame. Moreover, the two magnetic modules 301 are each disposed inside a corresponding supporting parts 3042, so that the shake of the support frame in the width direction of the supporting apparatus 300 may be avoided, and the state stability of the support frame in the movement process is further improved.

According to a second aspect of an example of the present disclosure, a screen assembly is provided. The screen assembly includes a flexible display screen 100 and one or more supporting apparatus 300 in the first aspect, wherein each supporting apparatus 300 is used for extending or contracting one side of the display screen 100.

In an example, the display screen 100 includes a display layer 101, a protective layer 102 (TP DECO) and a flexible metal layer 103. The display layer 101 and the flexible metal layer 103 are respectively disposed at opposite sides of the protective layer 102, and the flexible metal layer 103 is distributed in a to-be-supported area of the protective layer 102, wherein the to-be-supported area is an area where the protective layer 102 is in contact with the overturning curved surface 3043 in the extension/contraction process of the adjustable rod 3022.

The protective layer 102 may be attached to the display layer 101 by an adhesive. The flexible metal layer 103 may be a flexible steel sheet, and the flexible metal layer 103 may be injection-molded on the protective layer 102 by adopting an in-mold injection. The flexible metal layer 103 is disposed in the to-be-supported area, so that rigid support may be provided for the display layer 101 and the protective layer 102 when the display screen 100 is in the extension state, and problems of sinking or the like may be avoided. Further, the state stability of the display screen 100 is improved, and cost waste and weight increment caused by disposing the flexible metal layer 103 on the overall protective layer 102 are avoided.

According to a third aspect of an example of the present disclosure, a terminal device is provided, including the screen assembly in the second aspect.

The terminal device may include a terminal device main body 400, a rear cover 200 and a screen assembly. When the screen assembly is in a contraction state, a to-be-supported area of the screen assembly overturns to a rear of the terminal device, and a tail end of the screen assembly abuts against the rear cover 200 at the rear of the terminal device to close the rear of the terminal device. When the screen assembly is in an extension state, the tail end of the screen assembly extends to the position of an overturning curved surface 3043, and a support frame extends to an extreme position, so that a magnetic module 301 and a part of the adjustable rod 3022 are exposed.

The terminal device may be a device such as a smart phone, a tablet personal computer, a desktop/laptop/handheld computer, a notebook computer, an ultra-mobile personal computer (UMPC), a netbook, a cell phone, a personal digital assistant (PDA) and an augmented reality (AR)/virtual reality (VR) device, etc. The specific form of the terminal device is not intended to be limited in the examples of the present disclosure.

Those skilled in the art will readily conceive other implementation solutions after considering the specification and putting the present disclosure disclosed herein into practice. The present disclosure aims at covering any variations, purposes or adaptive changes of the present disclosure, and these variations, purposes or adaptive changes conform to a general principle of the present disclosure and include common general knowledge or conventional technical means in the undisclosed technical field of the present disclosure.

It will be understood that the present disclosure is not limited to the exact construction that has been described above and illustrated in the accompanying drawings, and that various modifications and changes may be made without departing from the scope thereof. The scope of the present disclosure is merely limited by the appended claims.

What is claimed is:

1. A supporting apparatus for supporting a flexible display screen, comprising:
   a support frame comprising an overturning curved surface; and
   a driving mechanism disposed at a side, away from the overturning curved surface, of the support frame, wherein the driving mechanism comprises an adjustable rod configured to extend or contract in an adjustment direction,
   wherein an axial direction of the overturning curved surface is perpendicular to the adjustment direction of the adjustable rod, and
   wherein the adjustable rod is configured to be connected with the display screen overturned along the overturning curved surface, and the adjustable rod is configured to push the support frame for pushing the display screen to move during extension and to pull the display screen for pulling the support frame to move during contraction,
   wherein the support frame comprises an adjustment channel for accommodating the adjustable rod, and a first sliding chute passing through a side wall of the adjustment channel, wherein an extension direction of the first sliding chute is parallel to an axial direction of the adjustment channel,
   wherein a first sliding block is disposed in the first sliding chute, a first end of the first sliding block being connected with the display screen, and a second end of the first sliding block extending into the adjustment channel, and
   wherein when extending and abutting against a bottom wall of the adjustment channel, the adjustable rod is configured to push the support frame to move, and when contracting, the adjustable rod is configured to pull the first sliding block to slide along the first sliding chute.

2. The supporting apparatus of claim 1, wherein a tail end of the adjustable rod is provided on a bearing base, wherein one or more bearings are sleeved on the bearing base, and an outer ring of a bearing is connected with the side wall of the adjustment channel.

3. The supporting apparatus of claim 2, wherein the adjustable rod or the bearing base comprises a protrusion matched with the first sliding block, and the protrusion is configured to abut against the first sliding block when the adjustable rod contracts.

4. The supporting apparatus of claim 1, wherein the driving mechanism comprises a hydraulic module and a magnetic module, wherein the hydraulic module comprises a hydraulic main body and the adjustable rod, and the magnetic module supplies power for the hydraulic main body.

5. The supporting apparatus of claim 4, comprising one or more driving mechanisms,
   wherein the support frame comprises a support frame main body and one or more supporting parts perpendicularly connected with the support frame main body, wherein a side, away from the supporting part, of the support frame main body is provided with the overturning curved surface, and the supporting part is provided with the adjustment channel and the first sliding chute; and
   wherein the one or more driving mechanisms are in one-to-one correspondence to the one or more supporting parts.

6. The supporting apparatus of claim 5, wherein the adjustable rod and the magnetic module are disposed at a same side of the hydraulic main body, and an extension direction of the magnetic module is parallel to the adjustment direction of the adjustable rod,
   wherein the magnetic module comprises a second sliding chute, and the supporting part comprises a second sliding block disposed in the second sliding chute and configured to slide along the second sliding chute, wherein an extension direction of the second sliding chute is same as the extension direction of the first sliding chute, and a depth direction of the second sliding chute is perpendicular to a depth direction of the first sliding chute.

7. The supporting apparatus of claim 6, wherein the second sliding block has magnetism, wherein when the second sliding block is close to the hydraulic main body, magnetism of the magnetic module is opposite to the magnetism of the second sliding block, and when the second sliding block is away from the hydraulic main body, the magnetism of the magnetic module is same as the magnetism of the second sliding block.

8. The supporting apparatus of claim 5, wherein the support frame comprises two supporting parts respectively connected with each end of the support frame main body, and the magnetic module of the driving mechanism is disposed inside a corresponding supporting part.

9. A screen assembly, comprising a flexible display screen and one or more supporting apparatus for supporting the display screen,
wherein the supporting apparatus comprises:
a support frame comprising an overturning curved surface; and
a driving mechanism disposed at a side, away from the overturning curved surface, of the support frame, wherein the driving mechanism comprises an adjustable rod configured to extend or contract in an adjustment direction,
wherein an axial direction of the overturning curved surface is perpendicular to the adjustment direction of the adjustable rod, and
wherein the adjustable rod is configured to be connected with the display screen overturned along the overturning curved surface, and the adjustable rod is configured to push the support frame for pushing the display screen to move during extension and to pull the display screen for pulling the support frame to move during contraction,
wherein each supporting apparatus is used for extending or contracting one side of the display screen,
wherein the support frame comprises an adjustment channel for accommodating the adjustable rod, and a first sliding chute passing through a side wall of the adjustment channel, wherein an extension direction of the first sliding chute is parallel to an axial direction of the adjustment channel,
wherein a first sliding block is disposed in the first sliding chute, a first end of the first sliding block being connected with the display screen, and a second end of the first sliding block extending into the adjustment channel, and
wherein when extending and abutting against a bottom wall of the adjustment channel, the adjustable rod is configured to push the support frame to move, and when contracting, the adjustable rod is configured to pull the first sliding block to slide along the first sliding chute.

10. The screen assembly of claim 9, wherein the display screen comprises a display layer, a protective layer and a flexible metal layer, wherein the display layer and the flexible metal layer are respectively disposed at opposite sides of the protective layer, and the flexible metal layer is distributed in a to-be-supported area of the protective layer, wherein the to-be-supported area is an area where the protective layer is in contact with the overturning curved surface in extension/contraction process of the adjustable rod.

11. The screen assembly of claim 9, wherein a tail end of the adjustable rod is provided on a bearing base, wherein one or more bearings are sleeved on the bearing base, and an outer ring of a bearing is connected with the side wall of the adjustment channel.

12. The screen assembly of claim 11, wherein the adjustable rod or the bearing base comprises a protrusion matched with the first sliding block, and the protrusion is configured to abut against the first sliding block when the adjustable rod contracts.

13. The screen assembly of claim 9, wherein the driving mechanism comprises a hydraulic module and a magnetic module, wherein the hydraulic module comprises a hydraulic main body and the adjustable rod, and the magnetic module supplies power for the hydraulic main body.

14. The screen assembly of claim 13, comprising one or more driving mechanisms,
wherein the support frame comprises a support frame main body and one or more supporting parts perpendicularly connected with the support frame main body, wherein a side, away from the supporting part, of the support frame main body is provided with the overturning curved surface, and the supporting part is provided with the adjustment channel and the first sliding chute; and
wherein the one or more driving mechanisms are in one-to-one correspondence to the one or more supporting parts.

15. The screen assembly of claim 14, wherein the adjustable rod and the magnetic module are disposed at a same side of the hydraulic main body, and an extension direction of the magnetic module is parallel to the adjustment direction of the adjustable rod,
wherein the magnetic module comprises a second sliding chute, and the supporting part comprises a second sliding block disposed in the second sliding chute and configured to slide along the second sliding chute, wherein an extension direction of the second sliding chute is same as the extension direction of the first sliding chute, and a depth direction of the second sliding chute is perpendicular to a depth direction of the first sliding chute.

16. The screen assembly of claim 15, wherein the second sliding block has magnetism, wherein when the second sliding block is close to the hydraulic main body, magnetism of the magnetic module is opposite to the magnetism of the second sliding block, and when the second sliding block is away from the hydraulic main body, the magnetism of the magnetic module is same as the magnetism of the second sliding block.

17. The screen assembly of claim 14, wherein the support frame comprises two supporting parts respectively connected with each end of the support frame main body, and the magnetic module of the driving mechanism is disposed inside a corresponding supporting part.

18. A terminal device, comprising a screen assembly, wherein the screen assembly comprises a flexible display screen and one or more supporting apparatus for supporting the display screen,
wherein the supporting apparatus comprises:
a support frame comprising an overturning curved surface; and
a driving mechanism disposed at a side, away from the overturning curved surface, of the support frame, wherein the driving mechanism comprises an adjustable rod configured to extend or contract in an adjustment direction,
wherein an axial direction of the overturning curved surface is perpendicular to the adjustment direction of the adjustable rod, and
wherein the adjustable rod is configured to be connected with the display screen overturned along the overturning curved surface, and the adjustable rod is configured to push the support frame for pushing the display screen to move during extension and to pull the display screen for pulling the support frame to move during contraction, wherein each supporting apparatus is used for extending or contracting one side of the display screen, wherein the support frame comprises an adjustment channel for accommodating the adjustable rod, and a first sliding chute passing through a side wall of the adjustment channel, wherein an extension direction of the first sliding chute is parallel to an axial direction of the adjustment channel, wherein a first sliding block is disposed in the first sliding chute, a first end of the first sliding block being connected with the display screen, and a second end of the first sliding block extending into the adjustment channel, and wherein when extending and abutting against a bottom wall of the adjustment channel, the adjustable rod is configured to push the support frame to move, and when contracting, the adjustable rod is configured to pull the first sliding block to slide along the first sliding chute.

* * * * *